(12) United States Patent
Schmidt et al.

(10) Patent No.: US 9,209,027 B1
(45) Date of Patent: Dec. 8, 2015

(54) ADJUSTING THE CHARGE CARRIER LIFETIME IN A BIPOLAR SEMICONDUCTOR DEVICE

(71) Applicant: Infineon Technologies AG, Neubiberg (DE)

(72) Inventors: Gerhard Schmidt, Wernberg-Wudmath (AT); Josef Georg Bauer, Markt Indersdorf (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 14/459,391

(22) Filed: Aug. 14, 2014

(51) Int. Cl.
*H01L 21/00* (2006.01)
*H01L 21/265* (2006.01)
*H01L 29/66* (2006.01)

(52) U.S. Cl.
CPC ........ *H01L 21/265* (2013.01); *H01L 29/66234* (2013.01)

(58) Field of Classification Search
CPC .................... H01L 31/035236; B82Y 20/00
USPC .................. 257/21, 618, 44, 139; 438/138
See application file for complete search history.

(56) References Cited

U.S. PATENT DOCUMENTS

| | | | |
|---|---|---|---|
| 3,953,243 A | 4/1976 | Goetzberger et al. | |
| 8,440,553 B2 | 5/2013 | Schmidt et al. | |
| 2003/0127645 A1* | 7/2003 | Drobnis et al. | 257/44 |
| 2006/0211179 A1* | 9/2006 | Siemieniec et al. | 438/138 |
| 2008/0296612 A1* | 12/2008 | Schmidt et al. | 257/139 |
| 2014/0021590 A1 | 1/2014 | Schulze et al. | |
| 2014/0374882 A1* | 12/2014 | Siemieniec et al. | 257/618 |

FOREIGN PATENT DOCUMENTS

| | | |
|---|---|---|
| DE | 19543922 A1 | 5/1997 |
| DE | 102007020039 A1 | 10/2008 |
| EP | 0694960 B1 | 7/2002 |
| WO | 9305535 | 3/1993 |
| WO | 9635229 | 11/1996 |

OTHER PUBLICATIONS

"Heavy metals" a meaningless term? (IUPAC Technical Report) J.H.Duffus, Pure Appl. Chem., 2002, vol. 74, No. 5, pp. 793-807 http://iupac.org/publications/pac/74/5/0793/.*
"Diffusion" (2003). In the Macmillan Encyclopedia. Basingstoke, United Kingdom: Macmillan Publishers Ltd. Retrieved from http://search.credoreference.com/content/entry/move/diffusion/0.*
Graff, Klaus, "Metal Impurities in Silicon-Device Fabrication", Springer Series in Materials Science, Jun. 1994, pp. 98-105.
Jacob, et al., "Determination of Vacancy Concentrations in the Bulk of Silicon Wafers by Platinum Diffusion Experiments", Journal of Applied Physics, http://dx.doi.org/10.1063/1.365796, American Institute of Physics, vol. 81, Jul. 1, 1997, pp. 182-191.
Strunk, et al., "Interstitial Supersaturation Near Phosphorus-Diffused Emitter Zones in Silicon", American Institute of Physics, vol. 34, No. 8, Apr. 15, 1979, pp. 530-532.

* cited by examiner

*Primary Examiner* — Jami M Valentine
(74) *Attorney, Agent, or Firm* — Murphy, Bilak & Homiller, PLLC

(57) ABSTRACT

A method includes implanting recombination center atoms via a first surface into a semiconductor body and causing the implanted recombination center atoms to diffuse in the semiconductor body in a first diffusion process.

25 Claims, 8 Drawing Sheets

FIG 7A  DOPANT ATOMS

DIFFUSING/ACTIVATING
THE IMPLANTED
DOPANT ATOMS

DIFFUSING/ACTIVATING
THE DOPANT ATOMS
FROM LAYER 220

ADJUSTING THE CHARGE CARRIER LIFETIME IN A BIPOLAR SEMICONDUCTOR DEVICE

TECHNICAL FIELD

This disclosure in general relates to adjusting the charge carrier lifetime, and more particularly to adjusting the minority charge carrier lifetime in a bipolar power semiconductor device.

BACKGROUND

A bipolar power semiconductor device such as, for example, a power diode, a power IGBT, or a power thyristor, includes a first emitter region of a first conductivity type (doping type), a second emitter of a second conductivity type, and a base region (often referred to as drift region) of one of the first and second conductivity types. Usually, the base region has a lower doping concentration than each of the first and second emitter regions.

A bipolar power semiconductor device can assume two different operation states, namely a conducting state (on-state), and a blocking state (off-state). In the conducting state, the first emitter region injects charge carriers of the first conductivity type into the base region, and the second emitter region injects charge carriers of the second conductivity type into the base region. These charge carriers of the first and second conductivity type, respectively, form a charge carrier plasma in the base region.

When the bipolar power semiconductor device switches from the conducting state into the blocking state the charge carriers are removed from the base region. Losses that occur in the transition phase from the conducting state to the blocking state are dependent on how many charge carriers are present in the base region before the semiconductor device starts to switch from the conducting state to the blocking state, the higher the amount of charge carriers the higher the losses. Basically, the number of charge carriers can be adjusted by adjusting the charge carrier lifetime, in particular the minority charge carrier lifetime, which is the average time it takes for a minority charge carrier to recombine. The shorter the minority charge carrier lifetime, that is the faster minority charge carriers recombine, the lower is the amount of charge carriers in the base region at the time of switching from the conducting state to the blocking state. However, conduction losses, which are losses that occur in the bipolar power semiconductor device in the conducting state, increase as the charge carrier lifetime decreases.

When the bipolar power semiconductor device switches from the conducting state to the blocking state a depletion region expands in the base region beginning at a pn junction between the base region and a further device region such as, for example, an anode region in a diode. Through this charge carriers forming the charge carrier plasma are removed from the base region; this is known as reverse recovery. During reverse recovery a reverse recovery current flows caused by the removal of charge carriers from the base region. This current finally drops to zero as the charge carriers have been removed or recombined. A slope of this reverse recovery current as it tends to zero defines the softness of the component. The steeper the slope, the less "soft" is the reverse recovery behaviour (switching behaviour) of the diode. However, a soft behaviour is desirable, because steep slopes may cause voltage overshoots in parasitic inductances connected to the semiconductor device and/or may cause oscillations or ringing in a circuit in which the semiconductor device is employed.

A soft reverse recovery behaviour can be obtained by having a "charge carrier reservoir" in those regions of the base region that are depleted towards the end of the switching process, wherein this charge carrier reservoir feeds the reverse recovery current towards the end of the switching process so as to soften a decrease of the reverse recovery current to zero. Such a "charge carrier reservoir" can be obtained by having a high charge carrier lifetime in those regions of the base region that are depleted towards the end of the reverse recovery process.

There is therefore a need to suitably adjust the charge carrier lifetime in a bipolar semiconductor device in order to have low switching losses and a soft switching behaviour.

SUMMARY

One embodiment relates to a method. The method includes implanting recombination center atoms via a first surface into a semiconductor body, and causing the implanted recombination center atoms to diffuse in the semiconductor body in a first diffusion process.

Those skilled in the art will recognize additional features and advantages upon reading the following detailed description, and upon viewing the accompanying drawings.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

FIGS. 7A-7B show one embodiment of a method for providing dopant atoms in the region of one surface of the semiconductor body;

DETAILED DESCRIPTION

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Figure 1A:
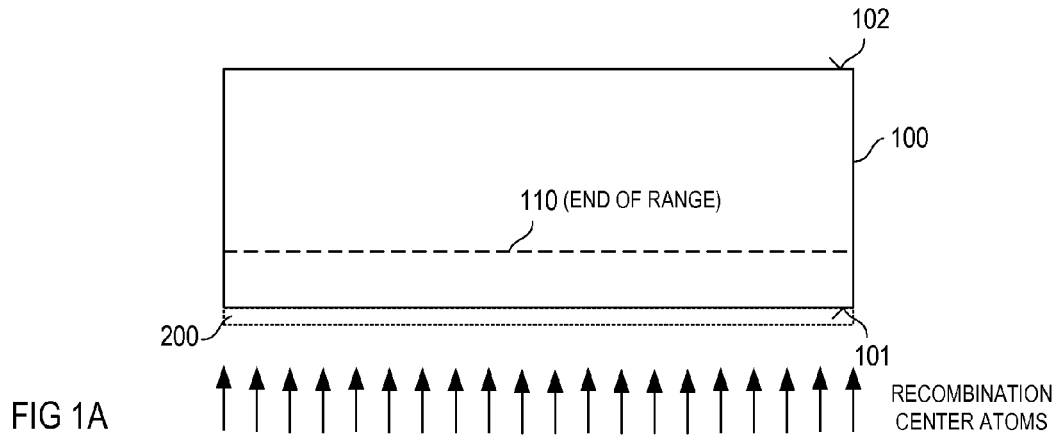
FIGS. 1A-1B illustrate one embodiment of a method for generating recombination centers in a semiconductor body in order to adjust the charge carrier lifetime.
Figure 1B:
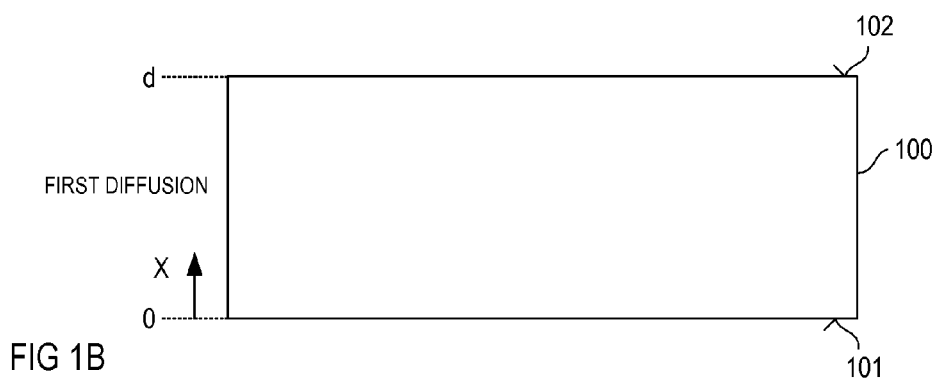

FIGS. 1A and 1B schematically illustrate one embodiment of a method for producing recombination centers in a semiconductor body 100 in order to adjust the charge carrier lifetime. In particular, the method relates to adjusting the minority charge carrier lifetime in the semiconductor body 100. The semiconductor body 100 includes a first surface 101 and a second surface 102 opposite the first surface 101. FIGS. 1A and 1B show vertical cross sectional views of a section of the semiconductor body 100 during different method steps of the method.

The semiconductor body 100 may include a conventional semiconductor material such as, for example, silicon (Si), silicon carbide (SiC), gallium nitride (GaN), gallium arsenide (GaAs), or the like. Although FIGS. 1A and 1B only show one section of one semiconductor body 100, the process steps explained with reference to FIGS. 1A and 1B, as well as process steps explained with reference to other figures herein below, can be applied at once to a plurality of semiconductor bodies that are part of a semiconductor wafer. That is, these process steps can be applied to a semiconductor wafer which includes a plurality of semiconductor bodies, wherein the semiconductor wafer can be subdivided into the plurality of semiconductor bodies at the end of the manufacturing process. According to another embodiment, one wafer includes (is comprised of) only one semiconductor body.

The semiconductor body may include a basic doping such as, for example, an n-type basic doping. For example, a doping concentration of this a basic doping is between $1E12\ cm^{-3}$ and $5E15\ cm^{-3}$, in particular between $1E13\ cm^{-3}$ and $1E14\ cm^{-3}$. Dopant atoms that cause the basic doping are, e.g., phosphorous (P) atoms.

Referring to FIG. 1A, the method includes implanting recombination center atoms via the first surface 101 into the semiconductor body 100. Implanting the recombination center atoms may include implanting the recombination centers all over the first surface 101. According to one embodiment, the recombination center atoms are directly implanted into the first surface 101. According to another embodiment, the recombination center atoms are implanted through a scattering layer 200 (illustrated in dashed lines) that is provided on the first surface 101. According to one embodiment, the scattering layer 200 includes an oxide such as, for example, silicon oxide ($SiO_2$). A thickness of the scattering layer 200 may be between 10 nanometers (nm) and 50 nanometers (nm).

According to one embodiment, the recombination center atoms include at least one of platinum (Pt) atoms and gold (Au) atoms. How deep the recombination center atoms are implanted into the semiconductor body 100 is dependent on an implantation energy. According to one embodiment the implantation energy is between 10 keV and 200 keV, in particular between 120 keV and 180 keV. In FIG. 1A, the dashed line labeled with reference character 110 illustrates the end of range of the implantation. That is, the dashed line illustrates how deep the recombination center atoms are implanted into the semiconductor body 100 from the first surface 101. The distance between the end of range 110 and the first surface 101 is dependent on the implantation energy and increases as the implantation energy increases. According to one embodiment, the implantation dose is between $1E11\ cm^{-2}$ and $1E14\ cm^{-2}$ in particular between $5E11\ cm^{-2}$ and $5E13\ cm^{-2}$.

Referring to FIG. 1B, the method further includes a first diffusion process which causes the implanted recombination center atoms to diffuse in the semiconductor body 100. In this diffusion process the recombination center atoms diffuse beyond the end of range in the direction of the second surface 102 but also in the direction of the first surface 101. Further, in the diffusion process, the recombination center atoms are incorporated into the crystal lattice on substitutional sites by occupying vacancies of the (monocrystalline) semiconductor body 100 such that the recombination center atoms may act as recombination centers for charge carriers. This is explained in further detail below.

The distribution of the recombination center atoms after the first diffusion process is dependent on the process parameters such as the implantation dose, the diffusion temperature and the duration of the diffusion process. According to one embodiment, the diffusion temperature is between 650° C. and 950° C., and the duration of the diffusion process is between 1 hour and 2 hours. The diffusion temperature can be substantially constant during the diffusion process. According to another embodiment, the diffusion temperature varies during the diffusion process.

Figure 2:
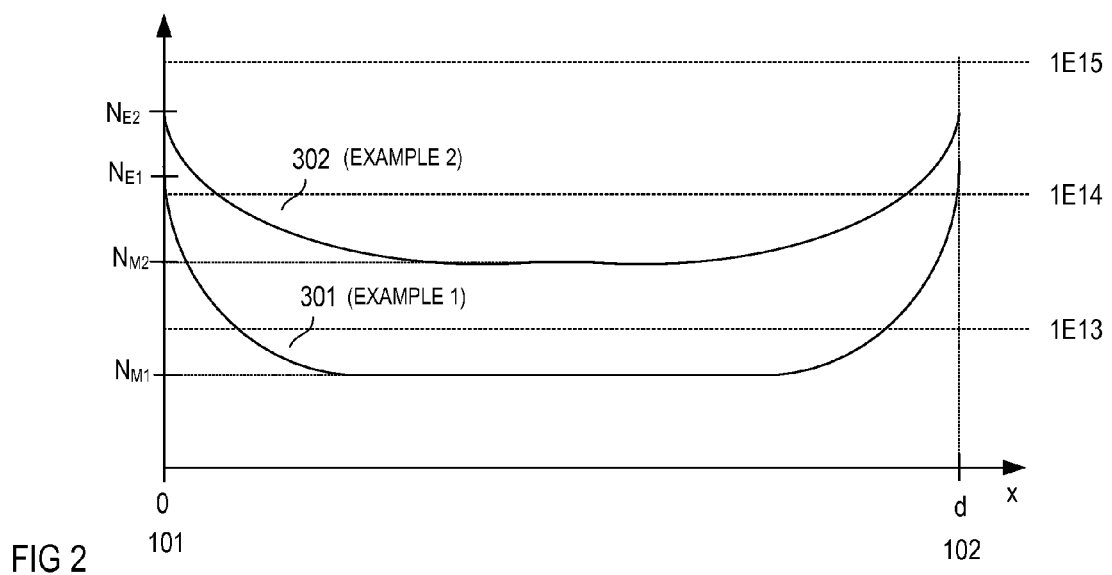
FIG. 2 shows two embodiments of a distribution of recombination centers in the semiconductor body obtained based on different process parameters.

FIG. 2 shows two examples of the distribution of the recombination center atoms in the semiconductor body 100 after the first diffusion process. FIG. 2 shows the distribution of the recombination center atoms over the vertical direction x of the semiconductor body 100. Referring to FIG. 2, the distribution of recombination center atoms is basically U-shaped. That is, after the first diffusion process there is a first maximum of the recombination center atom concentration at the first surface 101 (which corresponds to the vertical position 0 in FIG. 2), and a second maximum of the recombination center atoms at the second surface 102 (which corresponds to the vertical position d in FIG. 2), and there is a minimum distant to the first and second surfaces 101, 102. The recombination center atom concentration in the first maximum at the first surface 101 and the second maximum at the second surface 102 can be substantially the same.

FIG. 2 shows the distribution of active recombination center atoms in the semiconductor body 100. "Active recombination center atoms" are those recombination center atoms that are incorporated in the crystal lattice of the semiconductor body 100 such that the recombination center atoms may act as recombination centers for charge carriers in the semiconductor body 100. How many of the implanted recombination center atoms are activated is mainly dependent on the temperature in the diffusion process. This is explained with reference to two examples. In each of these examples platinum (Pt) atoms are implanted into a silicon (Si) semiconductor body with a thickness d of 500 micrometers (μm). The implantation dose $D_{Pt}$ is $5E12\ cm^{-2}$ in both examples. In the two examples, the diffusion parameters in the diffusion process are as follows.

Example 1

Temperature: 800° C.
Duration: 2 hours

Example 2

Temperature: 900° C.
Duration: 2 hours

That is, the two examples are only different in the diffusion temperature while the other parameters such as duration of the diffusion process and implantation dose are identical.

The distribution of the recombination center atoms (Pt atoms) obtained in the first example (Example 1) is represented by the distribution curve 301 shown in FIG. 2, and the distribution of recombination center atoms obtained in the second example (Example 2) is represented by curve 302 shown in FIG. 2. In the first example, the maximum concentration of activated recombination center atoms in the region of the first and second surfaces 101, 102 is higher than in the second example. The maximum concentration $N_{E1}$ in the first example is about $1E14$ cm$^{-3}$, and the maximum concentration $N_{E2}$ in the second example is about $5E14$ cm$^{-3}$. These maximum concentrations $N_{E1}$, $N_{E2}$ of the recombination center atoms at the first and the second surface 101, 102 will be referred to as surface concentrations in the following.

FIG. 2 shows the distribution of the recombination center atoms on a logarithmic scale. As can be seen from FIG. 2, the amount of activated recombination center atoms in the second example (see curve 302) is significantly higher than in the first example (see curve 302). At the lower diffusion temperature (800° C.) in the first example only about 13% of the implanted recombination center atoms are activated, while at the higher diffusion temperature (900° C.) in the second example substantially all (100%) of the implanted recombination center atoms are activated. Thus, the diffusion temperature significantly influences the distribution of the activated recombination center atoms in the method explained with reference to FIGS. 1A and 1B.

Referring to FIG. 2, the diffusion temperature not only influences the amount of recombination center atoms that are activated, but also influences the profile of the distribution. At the higher temperature (see curve 302 in FIG. 2) the U-shaped profile is shallower. That is, as a result of the higher diffusion temperature a ratio between the surface concentration and the minimum concentration is smaller than in the first example at the lower diffusion temperature. That is, $N_{E2}/N_{M2} < N_{E1}/N_{M1}$, where $N_{M2}$ is the minimum recombination center concentration in the second example, and $N_{M1}$ is the minimum recombination center concentration in the first example.

In the second example, the surface concentration is below the so-called solubility limit. The "solubility limit" is dependent on the temperature and defines the maximum amount of recombination center atoms that can be activated when employing a conventional process in which recombination center atom are diffused into the semiconductor body from a layer on the surface of the semiconductor body. As will be explained further below, the method explained with reference to FIGS. 1A-1B makes it possible to achieve a concentration of recombination centers that is even higher than the solubility limit.

Figure 3:
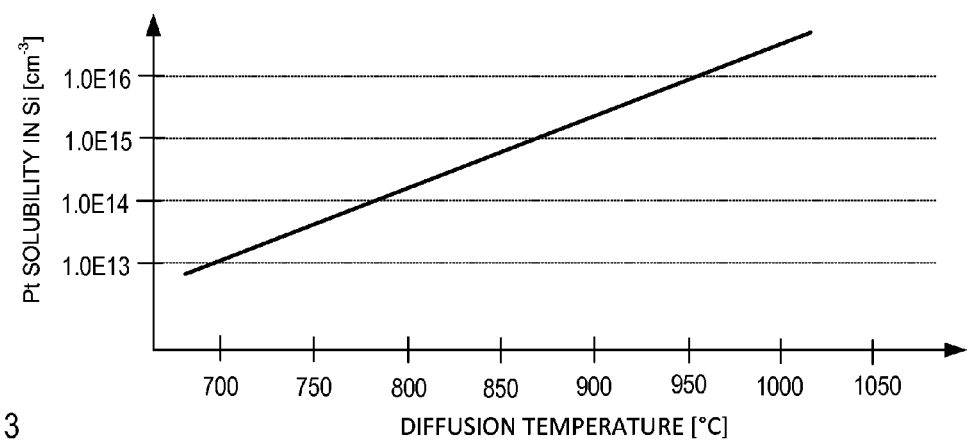
FIG. 3 illustrates the solubility limit of platinum (Pt) in silicon (Si) over the diffusion temperature.

FIG. 3 schematically illustrates the solubility limit of platinum (Pt) in silicon (Si) over the temperature. Referring to FIG. 3 the solubility increases as the diffusion temperature increases. In case of platinum (as illustrated in FIG. 3) the solubility increases from about $1.0E13$ at 700° C. to about $5.0E16$ at 1000° C. Referring to FIG. 3, the solubility limit at 800° C. is about $1.0E14$ cm$^{-3}$, and at 900° C. is about $2.0E15$ cm$^{-3}$. Thus, in the second example explained before, the surface concentration is below the solubility limit.

In a conventional process for introducing recombination center atoms into a semiconductor body, a metal-semiconductor alloy such as, for example, a platinum silicide is formed on one surface of a semiconductor body, and metal atoms (platinum atoms) diffuse from the alloy into the semiconductor body. In this conventional process, the surface concentration corresponds to the solubility limit. This, however, may cause problems in view of obtaining a soft switching behavior of a semiconductor device that is based on a semiconductor body with those relatively high surface concentrations of recombination center atoms. This explained in further detail herein below. Thus, based on the method explained with reference to FIGS. 1A-1B a lower surface concentration of recombination center atoms and a shallower U-profile of the recombination center atom distribution can be obtained.

Figure 4:
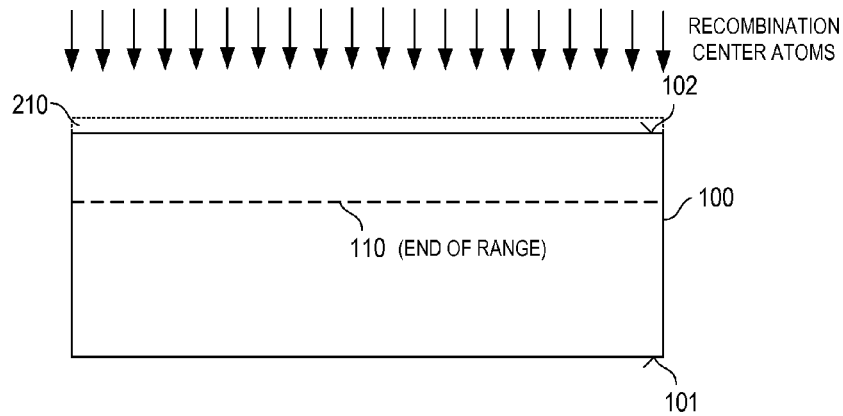
FIG. 4 illustrates a modification of the method illustrated in FIGS. 1A-1B.

Referring to FIG. 2, the surface concentrations at the first and second surfaces 101, 102 are substantially the same. That is, recombination center atoms that are implanted through the first surface 101, in the first diffusion process, diffuse to the first surface 101 and the second surface 102. Thus, the distribution of the recombination center atoms is widely independent of whether the recombination center atoms are implanted through the first surface 101 or the second surface 102. Referring to one embodiment shown in FIG. 4 the recombination center atoms are implanted through the second surface 102 instead of the first surface 101. The distribution of recombination center atoms obtained in this method substantially corresponds to the distributions shown in FIG. 2.

According to another embodiment (not shown) recombination center atoms are implanted through both the first surface 101 and the second surface 102. That is, a first part of the overall implantation dose is implanted through the first surface 101 and a second part is implanted through the second surface 102.

As stated above, activated recombination center atoms (which will briefly be referred to as recombination centers in the following) promote the recombination of charge carriers and, therefore, influence the charge carrier lifetime. In particular, recombination centers influence the minority charge carrier lifetime in a semiconductor body. A distribution of recombination centers as shown in FIG. 2 may result in a lower charge carrier lifetime in regions close to the first and second surface 101, 102, and a higher charge carrier lifetime in regions in the middle between the first and second surfaces 101, 102. However, there are bipolar semiconductor devices where it is desirable to have a charge carrier lifetime in a region of one surface that is lower than the charge carrier lifetime obtained after the first diffusion process. That is, it may be desirable to have a charge carrier lifetime in the region of one surface that corresponds to the charge carrier lifetime in the middle of the semiconductor body, or is even below the charge carrier lifetime in the middle of the semiconductor body. This can be obtained by applying further method steps explained with reference to FIGS. 5A-5B.

For the purpose of explanation it is assumed that it is desired to increase the charge carrier lifetime in the region of the first surface 101. However, this is only an example. It is also possible to increase the charge carrier lifetime in the region of the second surface 102. In this case, the method steps applied to the first surface 101 and explained with reference to FIGS. 5A-5B need to be applied to the second surface 102.

Figure 5A:
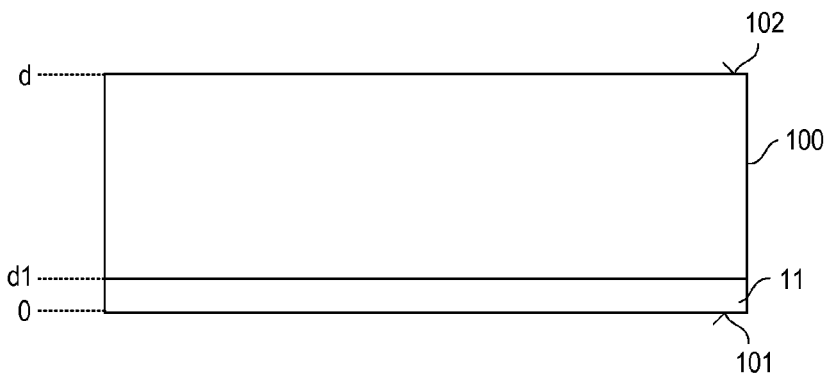
FIGS. 5A-5B illustrate one embodiment of reducing a recombination center concentration in the region of one surface of the semiconductor body.

Referring to FIG. 5A, the method includes forming a doped semiconductor region 11 in a semiconductor body 100 close to or adjoining the first surface 101. This doped semiconductor region 11 includes dopant atoms. According to one embodiment, the semiconductor body 100 has a basic doping of one doping type such as, for example, an n-doping before producing the doped region 11, and the doping type of the doped region 11 corresponds to the doping type of the basic doping. According to one embodiment, the doped region 11 is an n-type region and the dopant atoms are phosphorus (P) atoms. A maximum doping concentration of the doped region 11 is, for example, between $1E19\,cm^{-3}$ and $1E21\,cm^{-3}$. Forming the doped region 11 includes introducing dopant atoms into those regions where the doped region 11 is to be formed, and activating the introduced dopant atoms. Introducing the dopant atoms may include at least one of an implantation and diffusion process. This is explained in further detail herein below. Activating the dopant atoms includes incorporating the dopant atoms into the crystal lattice of the semiconductor body. The dopant atoms incorporated into the crystal lattice cause stress in the crystal lattice.

Figure 5B:
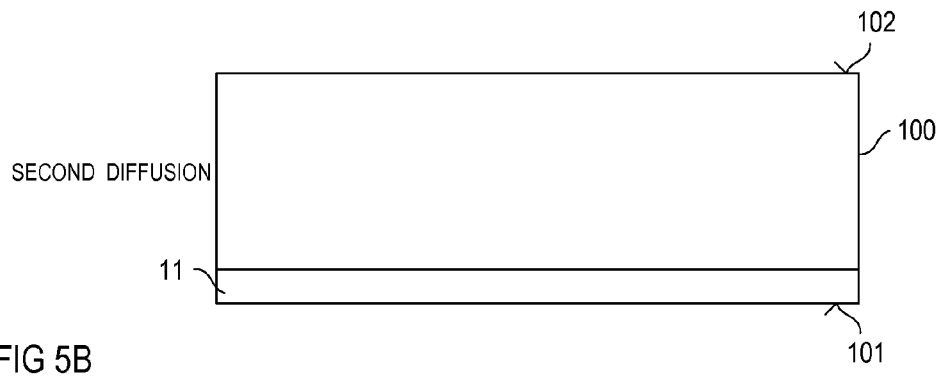

Referring to FIG. 5B, the temperature in a second diffusion process and the stress in the crystal lattice cause self-interstitials to form in the doped region 11 and to diffuse from the doped region 11 deeper into the semiconductor body 100, that is, into those regions of the semiconductor body 100 that have the basic doping. The temperature in the second diffusion process is, for example, between 500° C. and the temperature of the first diffusion process. The duration of the second diffusion process is, for example, between 1 hour and 2 hours. The recombination center atoms can be introduced into the semiconductor body before or after the doped region 11 is produced, but, in either case, are introduced before the second diffusion process.

The self-interstitials diffusing deeper into the semiconductor body replace activated recombination center atoms (recombination centers) so that in those regions into which the self-interstitials diffuse the concentration of recombination centers is reduced by kick-out, that is, by moving recombination center atoms from substitutional sites to interstitial lattice sites where they are mobile, so that they can be gettered by the highly doped layer. This is schematically illustrated in FIG. 6 which shows the concentration of recombination centers in the semiconductor body 100 after the process steps explained with reference to FIGS. 5A-5B.

Figure 6:
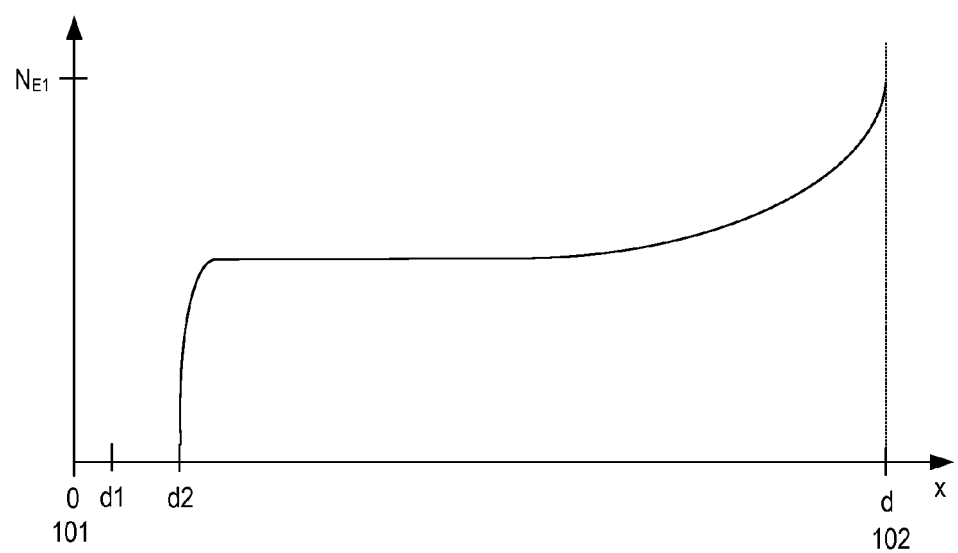
FIG. 6 shows the recombination center distribution in the semiconductor body obtained based on the method explained with reference to FIG. 5A-5B.

Referring to FIG. 6, the concentration of recombination centers is substantially 0 in the doped region 11 (wherein d1 denotes the depth of the doped region 11 as seen from the first surface 101) and beyond the doped region 11 in those regions where the self-interstitials diffuse in the second diffusion process. In FIG. 6, d2 denotes the depth (as seen from the first surface 101) of the region in which the concentration of recombination centers is substantially zero, where d2>d1.

Further, adjacent the doped region 11, the concentration of recombination centers may substantially correspond to the minimum concentration in the middle of the semiconductor body. That is, the concentration of recombination centers in the region adjacent the doped region 11 is lower than in the same regions after the second diffusion process.

Figure 7B:
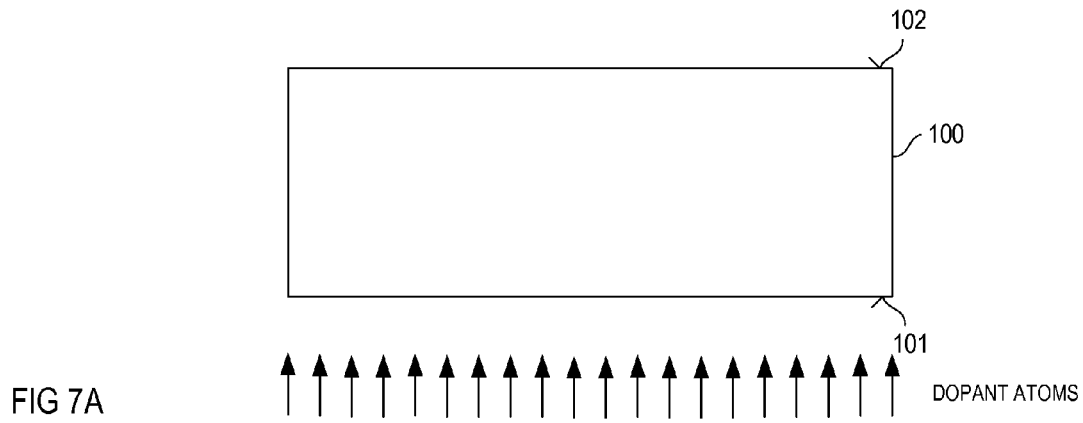
Figure 7B:
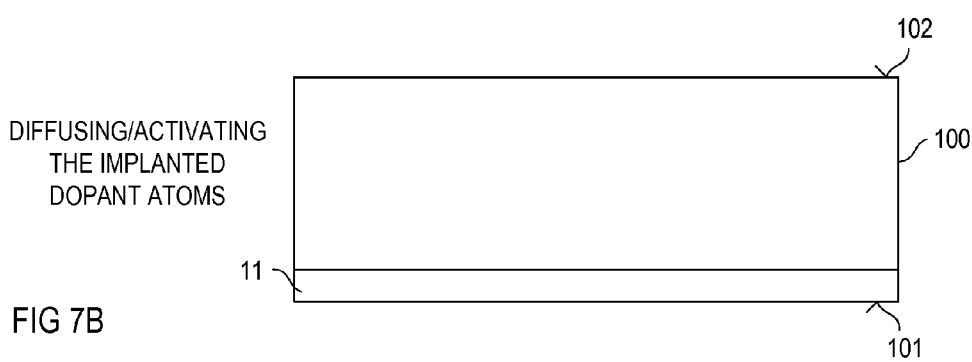

There are different ways to produce the doped region 11. Two embodiments are explained with reference to FIGS. 7A-7B and 8A-8B below. Referring to FIGS. 7A-7B, producing the doped region 11 may include implanting dopant atoms through the first surface 101 into the semiconductor body 100 (see FIG. 7A), and activating the implanted dopant atoms in an activation process so as to form the doped region 11 (see FIG. 7B). The activation process may include annealing the semiconductor body 100, at least in the region of the first surface 101. Annealing may include heating the semiconductor body to temperatures of between 900° C. and 950° C. for a predefined activation time such as, for example, several minutes.

Figure 8A:
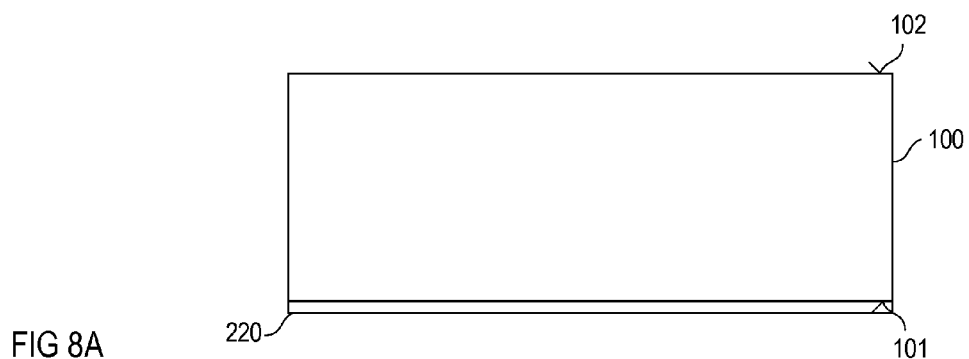
FIGS. 8A-8B show another embodiment of a method for providing dopant atoms in the region of one surface of the semiconductor body.
Figure 8B:
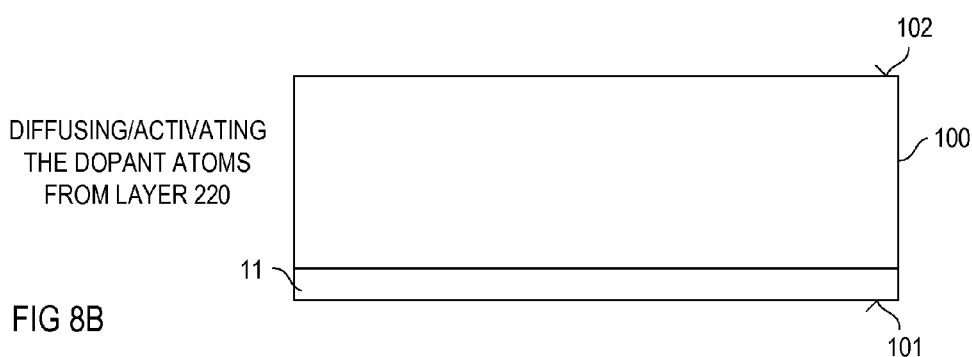

Referring to FIGS. 8A-8B producing the doped semiconductor region 11 may include depositing dopant atoms from a gaseous dopant source on the first surface 101, and diffusing the deposited dopant atoms from the first surface 101 into the semiconductor body 100. According to one embodiment, the dopant atoms are phosphorous (P) atoms, and the gaseous dopant source is one of $PH_3$ and $POCl_3$.

That the method steps explained with reference to FIGS. 5A-5B are suitable to effectively reduce the concentration of recombination centers in those regions adjoining the doped region 11 can be verified experimentally by measuring the forward voltage of bipolar diodes that were produced based on different semiconductor bodies, namely based on semiconductor bodies which only underwent the implantation and first diffusion process explained with reference to FIGS. 1A-1B, and based on semiconductor bodies which additionally underwent the second diffusion process explained with reference to FIG. 5B.

Figure 9:
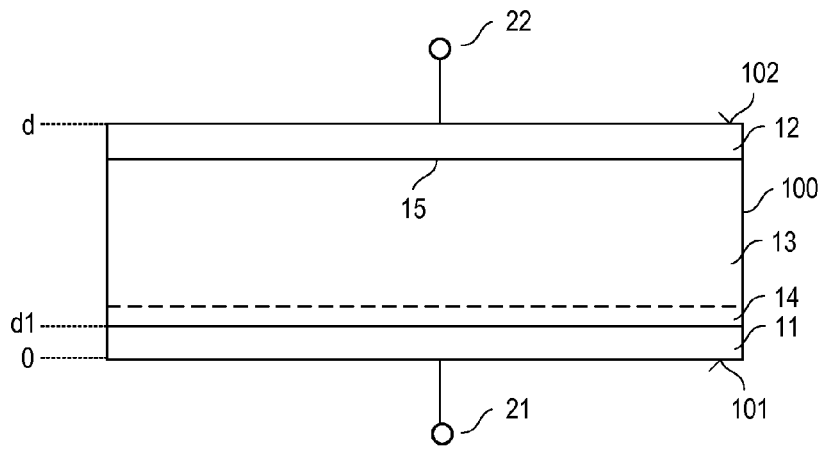
FIG. 9 shows one embodiment of a diode which is based on a semiconductor body shown in FIG. 4B.

FIG. 9 shows one embodiment a bipolar diode which is based on the semiconductor body shown in FIG. 5B and which has a distribution of recombination centers as illustrated in FIG. 6. Referring to FIG. 9, the diode includes a first emitter region adjacent a first surface 101. This first emitter region 11 is formed by the doped region 11. The bipolar diode further includes a second emitter region 12 adjacent the second surface 102, and a base region 13 that separates the first emitter region 11 and the second emitter region 12. The second emitter region 12 has a doping type complementary to the doping type of the first emitter region 11 and a higher doping concentration than the base region 13. The doping concentration of the base region 13 may correspond the basic doping of the semiconductor body 100. Optionally, the bipolar diode further includes a field-stop region 14 of the same doping type as the first emitter region 11 and more highly doped in the base region 13. According to one embodiment, the field-stop region 14 adjoins the first emitter region 11. Referring to another embodiment (not shown) the field-stop region 14 is distant to the first emitter region 11.

Referring to FIG. 9, the bipolar diode further includes a first load terminal 21 connected to the first emitter region 11, and a second load terminal 22 connected to the second emitter region 12. For the purpose of explanation it is assumed the first emitter region 11 is n-doped and the second emitter region 12 is p-doped. In this case, first load terminal 21 is a cathode terminal and the second load terminal 22 is an anode terminal of the bipolar diode. Further, it is assumed that the base region 13 has the same doping type as the first emitter region 11 so that a pn-junction 15 is formed between the second emitter region 12 and the base region 13.

Depending on a voltage applied between the first and second load terminals 21, 22 the bipolar diode is either conducting (in a conducting mode) or blocking (in a blocking mode). The bipolar diode is conducting when the voltage applied between the first and second load terminals 21, 22 has a polarity that forward biases the pn-junction 15, and the bipolar diode is blocking when the voltage applied between the first and second load terminals 21, 22 has a polarity that reverse biases the pn-junction 15.

When the bipolar diode is conducting the second emitter region 11 injects charge carriers of a first type into the base region 13 and the second emitter region 12 injects charge carriers of a second type complementary to the first type into the base region 13. The charge carriers of the first type are electrons when the first emitter region 11 is n-doped, and the second charge carriers are holes when the second emitter region 12 is p-doped. The charge carriers injected by the first and second emitter regions 11, 12 into the base region 13 form a charge carrier plasma in the base region 13.

When the bipolar diode switches from the conducting mode to the blocking mode, a space charge region (depletion region) expands beginning at the pn-junction 15 in the base region 13. This depletion region expanding in the base region 13 causes the charge carrier plasma to be removed from the base region 13, wherein a current flows through the bipolar diode until the charge carrier plasma is completely removed from the base region 13.

The amount of charge carriers in the charge carrier plasma when the bipolar diode is conducting can be adjusted by adjusting the minority charge carrier lifetime in the base region 13. A stated above, the minority charge carrier lifetime can be adjusted by providing recombination centers in the base region 13. Basically, the higher the concentration of recombination centers, the lower the minority charge carrier lifetime, and the smaller the amount of charge carriers in the charge carrier plasma. Thus, the smaller the amount of charge carriers in the charge carrier plasma, the lower are reverse recovery losses, which are the losses that occur when the bipolar diode switches from the conducting mode to the blocking mode. The higher the amount of charge carriers in the charge carrier plasma, the longer it takes for the charge carrier plasma to be removed from the base region 13 and the longer a current flows through the bipolar diode when the bipolar diode switches from the conducting mode to the blocking mode.

At the end of the reverse recovery process, that is, at the end of the process in which the charge carrier plasma is removed from the base region 13 the current through the bipolar diode turns to zero. Since abrupt changes of the current through the bipolar diode may cause voltage peaks in inductances in a circuit (not shown) connected to the bipolar diode it may be desirable for the current at the end of the reverse recovery process to "softly" turn to zero. This can be obtained by suitably adjusting the minority charge carrier lifetime in those regions of the base region 12 that are depleted towards the end of the reverse recovery process. In the bipolar diode shown in FIG. 9, these are the regions distant to the pn-junction 15 and close to the first emitter region 11 and the field-stop region 14, respectively. In particular, the charge carrier lifetime is adjusted such that the charge carrier lifetime in those regions of the base region 13 which are depleted towards the end of the reverse recovery process corresponds to the minority charge carrier lifetime or is even higher than the minority charge carrier lifetime in those regions closer to the pn-junction 15 and depleted at the beginning of the reverse recovery process.

Referring to FIG. 6, the method explained with reference to FIGS. 1A-1B and 5A-5B results in a semiconductor body that meets these requirements concerning the charge carrier lifetime. This has been verified by producing six samples of bipolar diodes that are based on differently processed semiconductor bodies. The following features of the bipolar diode were identical in each of the samples:

| | |
|---|---|
| Basic n-doping of the semiconductor body (doping concentration of the base region 13) | 1E13 (specific resistance: 450 Ω cm) |
| Thickness d of the semiconductor body 100 | 520 μm |
| p-dopant dose of the second emitter region 12 | $3E13\ cm^{-2}$ |
| Depth d2 of the second emitter region 12 (distance between the second surface 102 and the pn-junction 15) | 6 μm |
| n-dopant dose of the first emitter region 11 | $5E15\ cm^{-2}$ |
| Depth d1 of the first emitter region 11 | 0.8 μm |
| Maximum doping concentration of the first emitter region 11 | $2E20\ cm^{-3}$ |
| Maximum doping concentration of the field-stop region 14 | $1E15\ cm^{-3}$ |
| Depth of the field-stop region 14 from the first surface 101 | 30 μm |

The individual samples were different in view of producing the recombination centers (adjusting the minority charge carrier lifetime). In four (samples 1-4) of the six samples, platinum atoms were implanted and diffused as explained with reference to FIGS. 1A-1B, while in two (samples 5-6) of the six samples platinum atoms were diffused from a platinum silicide in a conventional way. Further, in three of the six samples (samples 2, 4, 6) a second diffusion process was performed as explained with reference to FIGS. 5A-5B, while in the other three samples (samples 1, 3, 5) the second diffusion process was omitted. In case of sample 6, the platinum silicide was removed before the second diffusion process.

The details of producing the recombination centers in the individual semiconductor bodies are summarized below.

| Sample 1 | |
|---|---|
| Way of introducing platinum atoms | implantation |
| Implantation dose | $1E12\ cm^{-2}$ |
| Temperature of the first diffusion process | 825° C. |
| Temperature of the second diffusion process | — (no second diffusion process) |

| Sample 2 | |
|---|---|
| Way of introducing platinum atoms | implantation |
| Implantation dose | $1E12\ cm^{-2}$ |
| Temperature of the first diffusion process | 825° C. |
| Temperature of the second diffusion process | 600° C. |

| Sample 3 | |
|---|---|
| Way of introducing platinum atoms | implantation |
| Implantation dose | $2E12\ cm^{-2}$ |
| Temperature of the first diffusion process | 825° C. |
| Temperature of the second diffusion process | — (no second diffusion process) |

| Sample 4 | |
|---|---|
| Way of introducing platinum atoms | implantation |
| Implantation dose | 1E12 cm$^{-2}$ |
| Temperature of the first diffusion process | 825° C. |
| Temperature of the second diffusion process | 600° C. |

| Sample 5 | |
|---|---|
| Way of introducing platinum atoms | diffusion from a platinum silicide formed on one of the surfaces of the semiconductor body |
| Implantation dose | — |
| Temperature of the first diffusion process | 795° C. |
| Temperature of the second diffusion process | (no second diffusion process) |

| Sample 6: | |
|---|---|
| Way of introducing platinum atoms | diffusion from a platinum silicide formed on one of the surfaces of the semiconductor body |
| Implantation dose | — |
| Temperature of the first diffusion process | 795° C. |
| Temperature of the second diffusion process | 600° C. |

Recombination centers formed in the semiconductor body, in particular in the base region 13, not only reduce the minority charge carrier lifetime, but also increase the forward voltage $V_F$ of the bipolar diode. The "forward voltage" is the voltage between the first and second load terminals 21, 22 at a rated current flowing through the bipolar diode when the bipolar diode is in the conducting mode.

Figure 10:
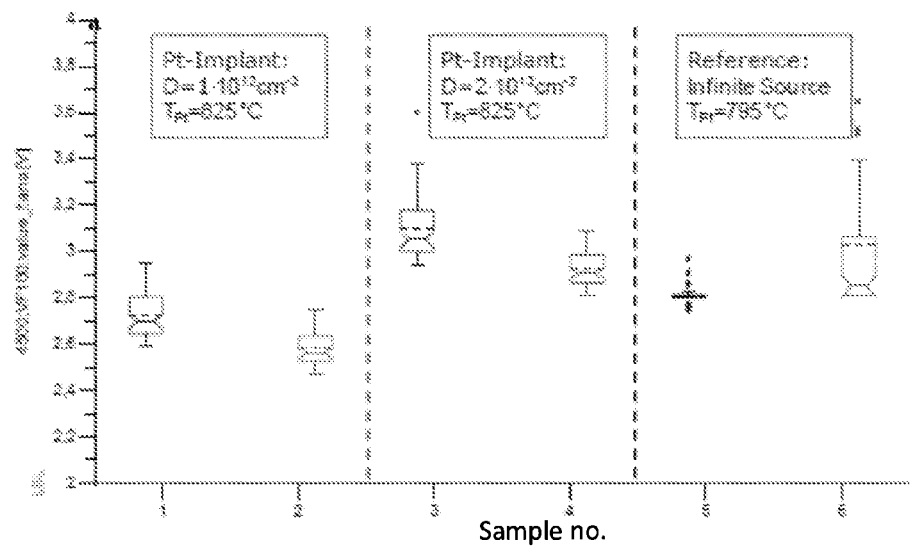
FIG. 10 shows forward voltages of six different diodes obtained by different processes.

In the diodes according to samples 1-6 explained above the forward voltage was measured at a rated current of 100 A. The forward voltages obtained in these measurements are illustrated in FIG. 10. Referring to the results obtained for samples 1 and 3, which are only different in the implantation dose of the platinum atoms, a higher implantation dose and, therefore, a higher concentration of recombination centers results in a higher forward voltage (the forward voltage of sample 3 is higher than the forward voltage of sample 1). The same can be seen from samples 2 and 4 which are only different in the implantation dose (the forward voltage of sample 4 is higher than the forward voltage of sample 2). Further, the forward voltage of sample 2 is lower than the forward voltage of sample 1, wherein samples 1 and 2 are only different in that a second diffusion process as explained with reference to FIGS. 5A-5B was performed in sample 2. This strongly indicates that the second diffusion process results in a reduction of recombination centers in the base region 13 in those regions in which self-interstitials diffuse from the doped region 11. The same result can be seen by comparing samples 3 and 4 which are only different in that a second diffusion process was performed in sample 4; the forward voltage $V_F$ obtained for sample 4 is lower than the forward voltage $V_F$ obtained for sample 3.

In the conventional process, that is the process of samples 5-6, no significant differences between the forward voltages was monitored. This strongly indicates that in the conventional process the concentration of recombination centers close to the surfaces of the semiconductor body is so high that no significant reduction of the recombination centers can be obtained by the second diffusion process.

Thus, if the surface concentration of the recombination centers is below the solubility limit, then the concentration of recombination centers can be effectively reduced by diffusing self-interstitials from the doped region 11 deeper into the semiconductor body. Recombination center concentrations below the solubility limit can be obtained by implanting recombination center atoms into the semiconductor body instead of diffusing the recombination center atoms from an alloy. In particular, implanting the recombination center atoms may include implanting the recombination center atoms with an implantation dose such that all (100%) of the implanted recombination center atoms are activated at a given temperature. This temperature is, for example, between 700° C. and 1000° C., in particular between 750° and 950° C.

Further, by suitably adjusting the process parameter in the process of implanting the recombination center atoms and diffusing the implanted recombination center atoms the temperature coefficient of the forward voltage can be adjusted. This is explained with reference to FIGS. 11-13 below.

Figure 11:
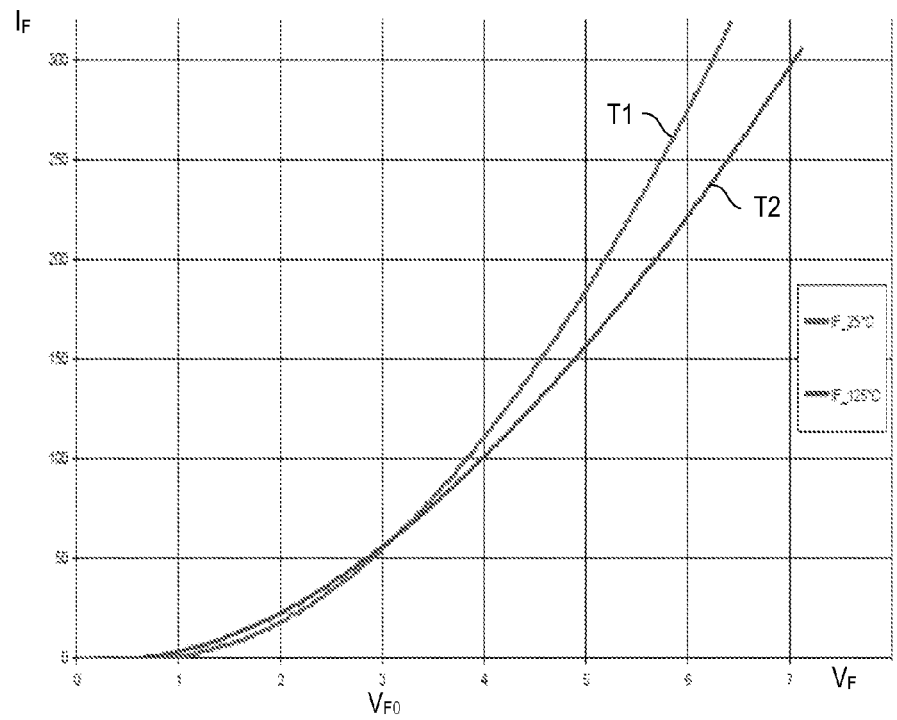
FIG. 11 shows the temperature dependence of the forward voltage of one embodiment of a diode.

FIG. 11 shows the forward voltage $V_F$ and the corresponding forward current $I_F$ of an example bipolar diode at a first temperature T1 such as, for example, 25° C. and a second temperature T2 such as, for example, 125° C. As can be seen from FIG. 11, the forward voltage $V_F$ increases as the forward current $I_F$ increases. The forward current $I_F$ is, for example, a current driven through the bipolar diode by a load (not shown in the figures) connected in series with the bipolar diode. The relationship between the forward voltage $V_F$ and the forward current $I_F$ is dependent on the temperature. That is, at different temperatures the forward voltage $V_F$ increases differently as the forward current increases. Generally, it is desirable for the forward voltage $V_F$ to have a positive temperature coefficient. A "positive temperature coefficient" means that at a given forward current $I_F$ which is equal to or higher than the rated current the forward voltage $V_F$ is the higher, the higher the temperature is. A "positive temperature coefficient" also means that at a given forward voltage $V_F$ the forward current $I_F$ is the lower, the higher the temperature is.

For example, a positive temperature coefficient of a bipolar diode is beneficial in a circuit application in which several bipolar diodes are connected in parallel. If each of the bipolar diode has a positive temperature coefficient and if the temperature of one of these bipolar diodes becomes higher than the temperatures of the other bipolar diodes, then the current through the bipolar diode with the higher temperature decreases. This has the effect that the power dissipated in the bipolar diode with the higher temperature decreases, so as to counteract a further increase of the temperature of this bipolar diode. In case of a negative temperature coefficient of the bipolar diodes, a higher temperature of one bipolar diode would result in an increasing current through this bipolar diode which, in turn, would result in an increase of power dissipated in the bipolar diode with the higher temperature, which would further increase the temperature of this bipolar diode and may finally cause the bipolar diode to be damaged or destroyed.

In the example shown in FIG. 11, the forward voltage $V_F$ has a positive temperature coefficient at operation points above a temperature stable operation point. Each operation point is defined by the forward voltage $V_F$ and the corresponding forward current $I_F$ at one temperature. The temperature stable operation point is defined by forward voltage $V_{F0}$ and a corresponding forward current $I_{F0}$, wherein the forward voltage $V_F$ is independent of the temperature in this operation point. At operation points below this temperature stable operation point $V_{F0}$, $I_{F0}$, the temperature coefficient is slightly negative.

Figure 12:
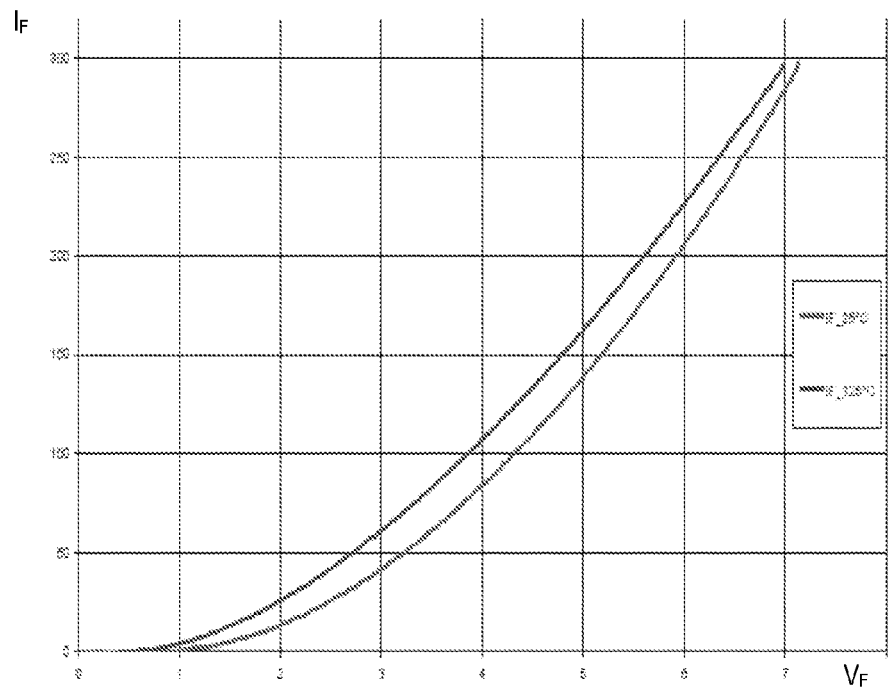
FIG. 12 shows the temperature dependence of the forward voltage of another embodiment of a diode.

FIG. 12 illustrates an example in which the forward voltage $V_F$ has a negative temperature coefficient. In this example, for each forward voltage $V_F$ the forward current $I_F$ increases as the temperature increases.

Experiments have shown that the temperature behavior of the forward voltage $V_F$ is dependent on the concentration of recombination centers in the base region 13 close to the pn junction 15. This is explained below.

In the conventional process explained before, the concentration of recombination centers can only be varied by varying the temperature at which the recombination centers diffuse from the alloy into the semiconductor body. In this conventional process, the surface concentration always corresponds to the solubility limit. In a power diode, such as a power diode explained with reference to the FIG. 9, the pn junction 15 is usually close to the surface. That is, a distance of the pn junction 15 to the nearest surface is usually less than 2% of the thickness of the semiconductor body 100. For example, in a (silicon) power diode with a voltage blocking capability of 4.5 keV the thickness d of the semiconductor body is about 500 micrometers while the distance of the pn junction to the second surface 102 is only about 6 micrometers, which is 1.2% of the thickness of the semiconductor body. Thus, the concentration of recombination centers in the region of the pn junction can be considered to substantially correspond to the surface concentration.

As stated above, the overall amount of recombination centers in the base region 13 affects the forward voltage, wherein the forward voltage $V_F$ increases as the overall amount of recombination centers increases. In the conventional process, the amount of charge carriers and, therefore, the forward voltage at a rated current can only be adjusted by the temperature. However, experiments have shown that producing the recombination centers in the conventional process results in a slightly negative temperature coefficient of the forward voltage.

While in the conventional method there is only one parameter that can be varied in order to adjust the overall amount of recombination centers in the base region, the method explained with reference to FIGS. 1A-1B includes two parameters that can be varied, namely the implantation dose of the recombination center atoms and the temperature in the first diffusion process. This is explained with reference to FIG. 13 below.

Figure 13:
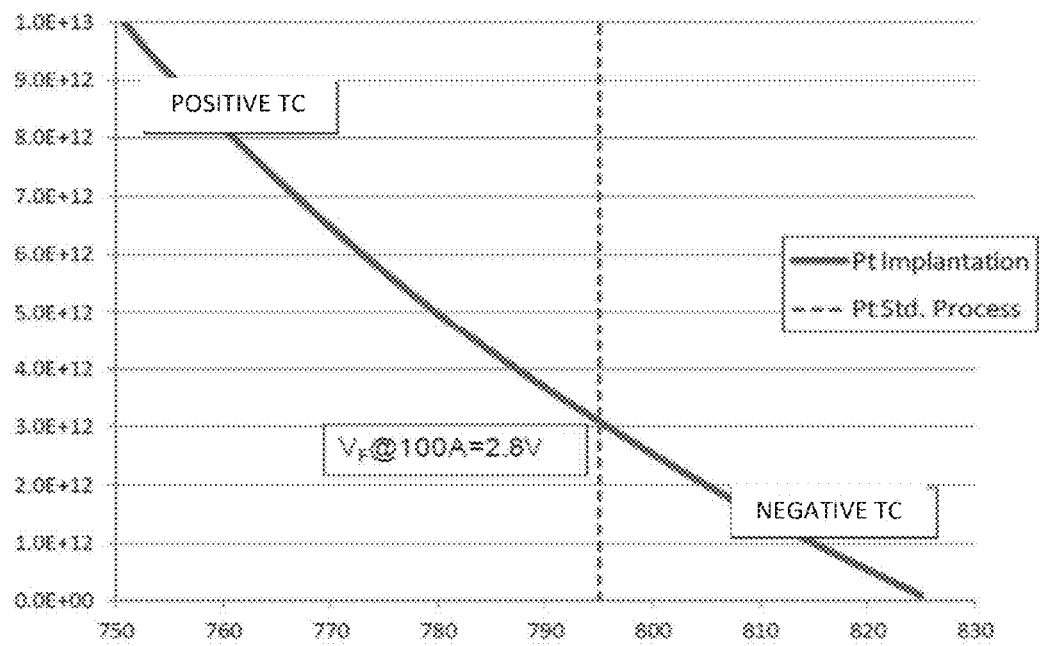
FIG. 13 illustrates the implantation doses of recombination center atoms and corresponding diffusion temperatures that result in the same amount of recombination centers in a diode.

FIG. 13 shows a curve that illustrates the implantation dose of recombination center atoms and the corresponding temperature in the first diffusion process in order to obtain a predefined amount of recombination centers in the base region 13 of a bipolar diode. This predefined amount of recombination centers corresponds to a predefined forward voltage at a rated current. The curve shown in FIG. 13 was based on a bipolar diode with the following parameters:

| | 1E13 (specific resistance: 450 Ω cm) |
|---|---|
| Basic n-doping of the semiconductor body (doping concentration of the base region 13) | |
| Thickness d of the semiconductor body 100 | 520 µm |
| p-dopant dose of the second emitter region 12 | 3E13 cm$^{-2}$ |
| Depth d2 of the second emitter region 12 (distance between the second surface 102 and the pn-junction 15 | 6 µm |

-continued

| | 1E13 (specific resistance: 450 Ω cm) |
|---|---|
| Basic n-doping of the semiconductor body (doping concentration of the base region 13) | |
| n-dopant dose of the first emitter region 11 | 5E15 cm$^{-2}$ |
| Depth d1 of the first emitter region 11 | 0.8 µm |
| Dopant dose of the field-stop region 14 | 8E11 cm$^{-2}$ |
| Depth of the field-stop region 14 from the first surface 101 | 60 µm |

At a rated current of, for example, 100 A this bipolar diode has a forward voltage $V_F$ of about 1.8V when no recombination centers are produced. Producing recombination centers increases the forward voltage $V_F$. In the experiment underlying the curve shown in FIG. 13 recombination centers were produced in the base region to such an extent that the forward voltage $V_F$ at the rated current was about 2.8V. In the example, the semiconductor body 100 includes silicon (Si) and the recombination center atoms are platinum (Pt) atoms.

In the following, the implanted dose of recombination centers and the corresponding temperature of the first diffusion process that result in a particular amount of recombination centers (a particular forward voltage $V_F$) will be referred to as parameter pair. In FIG. 13, parameter pairs that result in the same forward voltage (about 2.8 V in this example) are represented by the curve shown in the figure. Referring to FIG. 13, there is a plurality of parameter pairs that result in the same amount of recombination centers in the base region. The diffusion temperature increases as the implantation dose decreases. That is, at lower implantation doses higher temperatures are required to activate the desired amount of recombination center atoms. In other words, at higher implantation doses the corresponding temperature is smaller so that at higher implantation doses a smaller portion of the implanted recombination center atoms is activated in the base region than at lower implantation doses. In the experiment, the implantation dose was varied between 1E12 cm$^{-2}$ and 1E13 cm$^{-2}$ resulting in a variation of the temperature between about 750° C. and about 815° C. The dashed line in FIG. 13 represents the temperature (about 795° C.) that is required in the conventional process to diffuse in and activate recombination center atoms to such an extent that the forward voltage $V_F$ is about 2.8V.

Measurements have shown that the forward voltage $V_F$ of the diode produced in accordance with the standard process has a negative temperature coefficient (TC). The same applies to diodes produced with first diffusion temperatures higher than the temperature of the conventional process and relatively low implantation dose. However, at lower temperatures such as, for example, temperatures below 790° C. and higher implantation doses such as, for example, higher than 3E12 cm$^{-2}$ a positive temperature coefficient (TC) of the forward voltage was detected. One possible reason for this is explained below.

The implantation of recombination center atoms into the semiconductor body 100 causes implantation damages, so-called point defects. Those defects mainly occur in the region of that surface into which the recombination center atoms are implanted and the concentration of those defects increases as the implantation dose increases. Referring to the explanation above, the recombination center atoms can be implanted into the semiconductor body 100 via the first surface 101 or the second surface 102. However, in the first diffusion process, these defects rapidly diffuse in the semiconductor body 100 so that point defects can be found in the region of the implantation surface (which is the surface into which the ions are implanted) as well as in the region of the opposite surface. Thus, referring to the embodiments explained with reference to FIGS. 4 and 9, point defects in the second emitter region 12 can also be generated by implanting the recombination center atoms into the first surface 101 opposite the second surface 102.

These point defects enable platinum to be substitutionally incorporated into the crystal lattice of the semiconductor body 100. In particular, these point defects may result in a concentration of incorporated (activated) platinum atoms in the region of the first and second surface 101, 102 which is above the solubility limit at the temperature of the first diffusion process, such as above the solubility limit at a temperature of 790° C. or higher. "In the region of the first and second surfaces 101, 102" means in a region close to these first and second surfaces 102. That is, for example, in a region having a width of between 500 nanometers and 1 micrometer beginning at the respective surface 101, 102. For example, in a bipolar diode as shown in FIG. 9, the high platinum concentration in the region of the second surface, that is, in the region of the second emitter 12 reduces the efficiency of the second emitter 12, such that at a given (rated) current a voltage drop across the second emitter 12 increases as the operation temperature increase. This results in a positive temperature coefficient, while the increased voltage drop across the second emitter 12 does not significantly increase the forward voltage which is mainly defined by the base region 13 and the concentration of recombination center atoms therein.

The above explanation with regard to FIG. 13 may be summarized as follows. Referring to FIG. 13, the forward voltage $V_F$ substantially is the same, that is, the doping concentration of the base region (13 in FIG. 9) substantially is the same when the implantation dose increases but the temperature of the first diffusion process decreases. However, the higher implantation dose in connection with the higher concentration of implantation defects (which supposedly agglomerate in the region of the surfaces 101, 102) may result in concentrations of recombination centers in the region of the surfaces 101, 102 which are above the solubility limit at the temperature of the diffusion process. These high concentrations, in turn, reduce the efficiency of the emitter (the second emitter 12 in FIG. 9) which has a doping type complementary to the doping type of the base region 13 and, therefore, result in a positive temperature coefficient.

Figure 14:
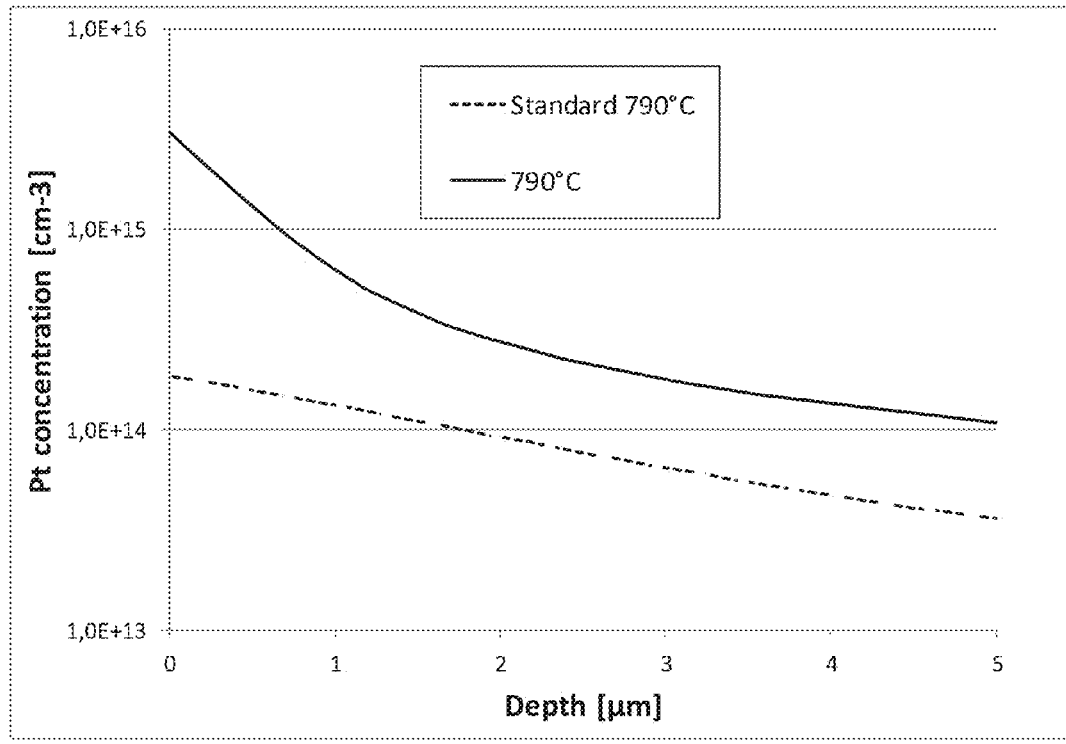
FIG. 14 illustrates a platinum concentration obtained in a semiconductor body by different process sequences.

It has been verified by experiments, that implanting recombination center atoms followed by a first temperature (diffusion) process may result in a concentration of recombination center atoms which is higher than the solubility limit at the temperature of the first temperature process. The result of one of these experiments is shown in FIG. 14. In this experiment, platinum atoms were diffused into a semiconductor body in accordance with a conventional diffusion process at a diffusion temperature of 790° C. The surface concentration obtained through this is illustrated in dashed lines in FIG. 14 (see the graph labeled "Standard 790° C." in FIG. 14). Further, in this experiment, platinum atoms were introduced in a comparable semiconductor body by implanting the platinum atoms and diffusing the implanted atoms at the same temperature as the conventional process, that is, at 790° C. The implantation dose was selected such that in an inner region of the semiconductor body, that is, a region corresponding to the base region in the embodiments explained herein before the concentration of recombination center atoms was substantially the same in both processes. Referring to FIG. 14 a significantly higher platinum concentration can be obtained by implanting and diffusing instead of diffusing, only. While the platinum concentration at the surface is about $2E14\ cm^{-3}$ (which corresponds to the solubility limit at 790° C.) in the conventional process it is about $3E15\ cm^{-3}$ in the implantation and diffusion process.

The implantation process explained with reference to FIG. 1A can be performed such that the recombination center atoms are implanted into the semiconductor body 100 all over the first surface 101. In this case, after the first diffusion process, there may be a vertical variation of the recombination center concentration as shown in FIG. 2. That is, the concentration of recombination centers may vary in the vertical direction of the semiconductor body 100 which is a direction perpendicular to the first surface. However, in a lateral direction, which is a direction parallel to the first surface 101 there is substantially no variation of the recombination center concentration.

Figure 15:
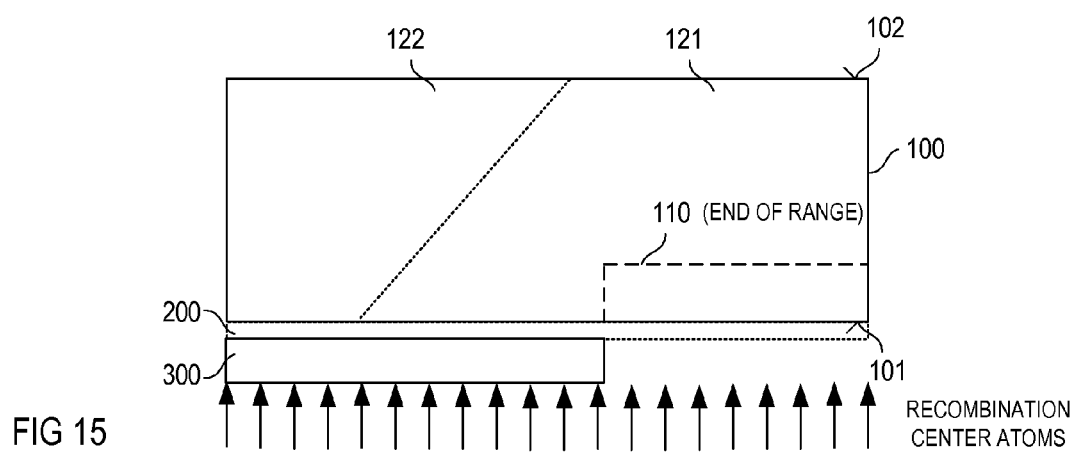
FIG. 15 illustrates a modification of the method illustrated in FIGS. 1A-1B.

According to one embodiment shown in FIG. 15 the recombination center atoms are implanted into the first surface 101 of the semiconductor body 100 using an implantation mask 300. The implantation mask covers sections of the first surface 101 and prevents recombination center atoms from being implanted in those regions of the first surface 101 covered by the implantation mask 300. In this process, a lateral variation of the recombination center concentration can be obtained. In particular, there can be regions of the semiconductor body 100 below the implantation mask 300 where, after the first diffusion process, the concentration of recombination centers is substantially zero. In the first diffusion process, the implanted recombination center atoms not only diffuse in the vertical direction of the semiconductor body 100 but also in the lateral direction. However, the maximum diffusion length in the lateral direction substantially can be adjusted by the thermal budget involved in the diffusion process, that is, by the temperature and the duration in the first diffusion process. According to one embodiment, the thermal budget is selected such that the diffusion width in the lateral direction substantially corresponds to the thickness d of the semiconductor body. Thus, dependent on the size of the implantation mask 300 there can be regions in the semiconductor body 100 where no recombination centers are produced. According to one embodiment, the temperature process is an RTA (Rapid Thermal Annealing) process.

In FIG. 15, the dotted line schematically illustrates the situation after the first diffusion process. The dotted line represents a border between those regions 121 of the semiconductor body 100 in which recombination center atoms diffuse from the end of range in the first diffusion process and those regions 122 in which recombination center atoms neither are implanted nor diffuse.

Such lateral variation of the recombination center atoms may be used in a variety of different semiconductor device. For example, the method can be used to adjust recombination centers substantially only in an edge region of a semiconductor device. This is explained with reference to FIG. 16.

Figure 16:
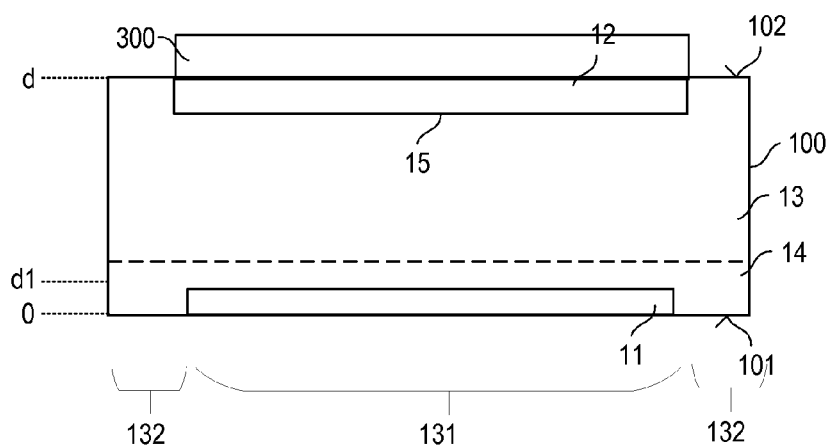
FIG. 16 shows one embodiment of a diode implemented in a semiconductor body having an inner region and an edge region.

FIG. 16 illustrates a vertical cross sectional view of a bipolar diode integrated in a semiconductor body 100. The semiconductor body includes an inner region 131 in which the first and second emitter regions 11, 12 and the base region 13 are arranged, and an edge region 132 that surrounds the inner region 131. The edge region 132 may adjoin an edge surface of the semiconductor body (as illustrated in FIG. 16). However according to another embodiment, the edge region 132 separates the inner region 131 with the active device regions (emitter regions 11, 129) from other devices integrated in the same semiconductor body. According to one embodiment, the method explained with reference to FIG. 14 is used to generate recombination centers in the edge region 132. In this embodiment, recombination center atoms are implanted via the first surface 101 or the second surface 102 into the semiconductor body 100 with an implantation mask 300 covering the inner region 131 and leaving uncovered the edge region. Such implantation mask is schematically illustrated on the second surface 102 in FIG. 16. In the implantation process a scattering layer (not shown in FIG. 15) can be used. After the implantation process, the implanted recombination center atoms diffuse in the semiconductor body 100 substantially in the edge region 132 so as to produce recombination centers in the edge region. The process parameters such as implantation dose, implantation energy, and diffusion temperature may correspond to the parameters explained before.

It should be noted that the methods explained with reference to FIGS. 1A-1B and 15 can be combined. That is, the method explained with reference to FIG. 1A-1B may be used to generate recombination centers all over the semiconductor body 100 while additionally the method explained with reference to FIG. 14 may be used to additionally produce recombination centers in selected regions of the semiconductor body 100.

The method explained with reference to FIG. 15 is not restricted to be used for producing recombination centers in an edge region of a semiconductor device, but may be used in each case where it is desired to selectively produce recombination centers in certain regions of a semiconductor body while omitting other regions of the semiconductor body. For example, an IGBT and a diode are integrated in one semiconductor body and recombination centers are only produced in those regions that include the diode.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second" and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method, comprising:
 implanting recombination center atoms via a first surface into a semiconductor body; and
 causing the implanted recombination center atoms to diffuse in the semiconductor body in a first diffusion process,
 wherein implanting the recombination center atoms comprises implanting the recombination center atoms with an implantation dose of between 1E11 $cm^{-2}$ and 1E14 $cm^{-2}$.

2. The method of claim 1, further comprising:
 providing dopant atoms in a region of one of the first surface and a second surface opposite the first surface of the semiconductor body; and
 causing the dopant atoms to diffuse in the semiconductor body away from the one of the first surface and the second surface in a second diffusion process.

3. The method of claim 1, wherein the recombination center atoms comprises metal atoms.

4. The method of claim 1, wherein the recombination center atoms are selected from the group consisting of:
 platinum (Pt) atoms;
 gold (Au) atoms; and
 palladium (Pd).

5. The method of claim 1, wherein implanting the recombination center atoms comprises implanting the recombination center atoms with an implantation dose of between 5E11 $cm^{-2}$ and 5E12 $cm^{-2}$.

6. The method of claim 1, wherein the first diffusion process comprises heating the semiconductor body to a temperature of between 650° C. and 950° C. for a duration of between 1 hour and 2 hours.

7. The method of claim 2, wherein the second diffusion process comprises heating the semiconductor body to a temperature of between 500° C. and a maximum of the temperature in the first diffusion process for a duration of between 1 hour and 2 hours.

8. The method of claim 1, further comprising introducing dopant atoms before implanting the recombination center atoms.

9. The method of claim 1, further comprising introducing dopant atoms after implanting the recombination center atoms.

10. The method of claim 1, further comprising introducing dopant atoms by implanting the dopant atoms into the semiconductor body via the one of the first surface and the second surface.

11. The method of claim 1, further comprising introducing dopant atoms by depositing the dopant atoms from a gaseous dopant source on one of the first surface and the second surface, and diffusing the deposited dopant atoms from the one of the first surface and the second surface into the semiconductor body.

12. The method of claim 1, wherein implanting the recombination center atoms comprises implanting the recombination center atoms through a scattering layer.

13. The method of claim 12, wherein the scattering layer is an oxide layer on the first surface.

14. The method of claim 13, wherein the oxide layer comprises a thickness of between 10 nanometers and 20 nanometers.

15. The method of claim 1,
wherein the semiconductor body comprises a basic doping of a first conductivity type, and
wherein the dopant atoms are dopant atoms of the first conductivity type.

16. The method of claim 15,
wherein the first conductivity type is n-type.

17. The method of claim 16, wherein the dopant atoms comprises phosphorous (P) atoms.

18. The method of claim 1, wherein implanting the recombination center atoms comprises implanting the recombination center atoms all over the first surface into the semiconductor body.

19. The method of claim 1, wherein implanting the recombination center atoms comprises implanting the recombination center atoms using an implantation mask which covers sections of the first surface and prevents recombination center atoms from being implanted into those sections of the first surface covered by the implantation mask.

20. The method of claim 1, wherein the concentration of the recombination centers in a region adjoining one of the first surface and the second surface is above the solubility limit at 800° C.

21. The method of claim 1, wherein implanting the recombination center atoms comprises implanting the recombination center atoms at such an implantation dose that, after the first diffusion process, the concentration of the recombination centers in a region adjoining one of the first surface and the second surface is above the solubility limit at the temperature of the first diffusion process.

22. The method of claim 2,
wherein the temperature of the second diffusion process is between 790° C. and 750° C., and
wherein the implantation dose is between 3E12 cm$^{-2}$ and 1E13 cm$^{-2}$.

23. A method, comprising:
implanting recombination center atoms via a first surface into a semiconductor body; and
causing the implanted recombination center atoms to diffuse in the semiconductor body in a first diffusion process,
wherein the first diffusion process comprises heating the semiconductor body to a temperature of between 650° C. and 950° C. for a duration of between 1 hour and 2 hours.

24. A method, comprising:
implanting recombination center atoms via a first surface into a semiconductor body; and
causing the implanted recombination center atoms to diffuse in the semiconductor body in a first diffusion process,
wherein implanting the recombination center atoms comprises implanting the recombination center atoms using an implantation mask which covers sections of the first surface and prevents recombination center atoms from being implanted into those sections of the first surface covered by the implantation mask.

25. A method, comprising:
implanting recombination center atoms via a first surface into a semiconductor body; and
causing the implanted recombination center atoms to diffuse in the semiconductor body in a first diffusion process,
wherein implanting the recombination center atoms comprises implanting the recombination center atoms at such an implantation dose that, after the first diffusion process, the concentration of the recombination centers in a region adjoining one of the first surface and the second surface is above the solubility limit at the temperature of the first diffusion process.

* * * * *